(12) United States Patent
Jung et al.

(10) Patent No.: US 7,605,404 B2
(45) Date of Patent: Oct. 20, 2009

(54) IMAGE PICKUP DEVICE AND METHOD OF MANUFACTURING THE SAME

(75) Inventors: Kyu Dong Jung, Yongin-si (KR); Woon Bae Kim, Yongin-si (KR); Min Seog Choi, Yongin-si (KR); Seung Wan Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 11/700,067

(22) Filed: Jan. 31, 2007

(65) Prior Publication Data
US 2008/0023780 A1    Jan. 31, 2008

(30) Foreign Application Priority Data
Jul. 28, 2006    (KR)    ...................... 10-2006-0071327

(51) Int. Cl.
*H01L 29/22* (2006.01)
*H01L 29/227* (2006.01)
*H01L 33/00* (2006.01)

(52) U.S. Cl. .................... 257/98; 257/99; 257/E31.001; 257/E33.001

(58) Field of Classification Search ............. 257/98–99, 257/E33.001, E31.001
See application file for complete search history.

(56) References Cited

U.S. PATENT DOCUMENTS

| 5,254,868 | A | 10/1993 | Saito |
| 6,188,094 | B1* | 2/2001 | Kochi et al. .................. 257/232 |
| 6,582,988 | B1* | 6/2003 | Hsiao et al. .................... 438/70 |
| 7,078,779 | B2* | 7/2006 | Wang et al. ................. 257/432 |
| 7,139,028 | B2* | 11/2006 | Itano et al. ................... 348/340 |
| 7,265,402 | B2* | 9/2007 | Koyanagi ..................... 257/292 |
| 7,297,916 | B1* | 11/2007 | Feng ....................... 250/208.1 |
| 7,342,268 | B2* | 3/2008 | Adkisson et al. ............ 257/291 |
| 7,358,110 | B2* | 4/2008 | Kim ............................ 438/69 |
| 7,449,357 | B2* | 11/2008 | Kim et al. ..................... 438/57 |
| 7,453,109 | B2* | 11/2008 | Koizumi et al. ............. 257/291 |

(Continued)

FOREIGN PATENT DOCUMENTS

JP    2003-273343 A    9/2003

(Continued)

*Primary Examiner*—Ida M Soward
(74) *Attorney, Agent, or Firm*—Sughrue Mion, PLLC

(57) ABSTRACT

An image pickup device includes a sensor substrate having image sensors arranged in its image pickup region in the form of a matrix. An interlayer insulating film layer is formed below a bottom of the sensor substrate. The interlayer insulating film layer includes wiring layers to construct an electric circuit. The wiring layer is electrically connected with the image sensors. A support substrate is attached on a bottom of the interlayer insulating film layer. The support substrate has contact electrodes formed in via holes. A lens layer is formed over the top surface of the sensor substrate to be opposite to the interlayer insulating film layer. A light-transmitting member is formed over the lens layer.

21 Claims, 8 Drawing Sheets

U.S. PATENT DOCUMENTS

| | | | |
|---|---|---|---|
| 2003/0025825 A1* | 2/2003 | Nakajoh | 348/374 |
| 2003/0063204 A1* | 4/2003 | Suda | 348/272 |
| 2003/0179457 A1* | 9/2003 | Dobashi et al. | 359/619 |
| 2006/0011813 A1* | 1/2006 | Park et al. | 250/208.1 |
| 2006/0094151 A1 | 5/2006 | Sumi | |
| 2006/0119950 A1* | 6/2006 | Boettiger et al. | 359/626 |
| 2006/0252175 A1* | 11/2006 | Maeda et al. | 438/75 |
| 2006/0261427 A1* | 11/2006 | Dillon et al. | 257/432 |
| 2008/0012083 A1* | 1/2008 | Gilton | 257/432 |
| 2008/0042227 A1* | 2/2008 | Asano et al. | 257/432 |

FOREIGN PATENT DOCUMENTS

| | | |
|---|---|---|
| KR | 10-2004-0039468 A | 5/2004 |
| KR | 10-2005-0043754 A | 5/2005 |
| KR | 10-2005-0047481 A | 5/2005 |
| KR | 10-2005-0103782 A | 11/2005 |

\* cited by examiner

IMAGE PICKUP DEVICE AND METHOD OF MANUFACTURING THE SAME

CROSS-REFERENCE TO RELATED APPLICATION

This application claims priority from Korean Patent Application No. 10-2006-0071327, filed on Jul. 28, 2006, in the Korean Intellectual Property Office, the disclosure of which is incorporated herein by reference.

BACKGROUND OF THE INVENTION

1. Field of the Invention

Methods and apparatuses consistent with the present invention relate to an image pickup device, and more particularly to, an image pickup device which can improve optical efficiency and packaging convenience, and a method of manufacturing the image pickup device.

2. Description of Related Art

FIG. 1 is a perspective view illustrating the outer appearance of a related art image pickup device, and FIG. 2 is a cross-sectional view illustrating the image pickup device of FIG. 1. In FIGS. 1 and 2, there is shown a related art complementary metal-oxide semiconductor (CMOS) type image pickup device.

Referring to FIGS. 1 and 2, the related art image pickup device 10 is mounted on a semiconductor substrate 1. Electrode pads formed in a peripheral circuit region adjacent to an image pickup region of the semiconductor substrate 1 and terminals of the semiconductor substrate 1 are electrically connected to one another via wires 2. After the image pickup device 10 has been mounted on the substrate 1, a module housing (not shown) may be securely mounted on the image pickup device or the substrate.

The image pickup device 10 includes a silicon semiconductor substrate 20, an interlayer insulating film layer 40 having a plurality of insulating layers, a color filter 50, and a lens layer having a plurality of microlenses 60, which are sequentially formed on top of one another. Formed on the silicon substrate 20 are image sensors or light-receiving portions corresponding to respective pixels. Light irradiated onto the top portion of the image pickup device 10 passes through the interlayer insulating film layer 40 and is then transferred to the image sensors 30 on the silicon substrate 20.

The image sensors 30 are buried in a top surface of the silicon substrate 20, and the interlayer insulating film layer 40 is formed on the top surface of the silicon substrate 20. The interlayer insulating film layer 40 is provided with multi-layered wiring layers 45, each of which is connected to a corresponding image sensor 30 so as to construct an electric circuit. As mentioned above, as the number of pixels of the image pickup device increases, the wiring intervals of the wiring layers 45 become narrow and the wiring layers 45 can be multi-layered. Also, as the wiring pitches are reduced and the wiring layers are multi-layered, the amount of light transmitted to the image sensors 30 decreases and the distance between the lens layer 60 and the image sensors 30 increases.

A consideration when manufacturing the image pickup device is to improve an optical sensitivity. A fill factor of the light-receiving portions may be increased in order to improve the optical sensitivity. However, the related art image pickup device 10 has a shortcoming in that the wiring layers 45 may intercept the incidence light and the amount of light transmitted to the image sensors and the optical sensitivity may decrease due to the shading effect of the wiring layers 45.

To increase the optical sensitivity, a maximum possible area of the light-receiving portion should be secured. To this end, it is necessary to design a structure in which the metallic wiring layers are disposed below the light-receiving portion. A back-illuminated image pickup device employing such a structure has been disclosed.

However, the back-illuminated image pickup device also includes a silicon semiconductor substrate, a plurality of interlayer insulating films having wiring layers buried therein, a color filter, and a lens layer having a plurality of microlenses, which are sequentially formed on top of each other. Unlike the related art image pickup device, in the back-illuminated image pickup device, the color filter, and the lens layer are formed over the top surface of the silicon substrate in such a manner as to be opposite to the interlayer insulating film layer Further, in the back-illuminated image pickup device, the silicon substrate may be attached on a support substrate and then the silicon substrate may be ground sufficiently thin so as to expose the image sensors to the outside. Also a color filter or microlenses may be formed on the silicon substrate.

In the existing back-illuminated image pickup device, since the wiring layers are not formed in an optical path, the optical sensitivity of the image sensors can increase and an adverse effect of the narrowed pitches and the multi-layered structure of the wiring layers on the optical sensitivity can be eliminated. Nevertheless, the back-illuminated image pickup device still has a shortcoming in that it is difficult to form electrodes and electrically connect the electrodes with an external substrate. The related art image pickup device has a disadvantage in that the electrode pads can be electrically connected to the substrate via the wires, but a larger installation space in addition to the image pickup region must be secured so as to form the electrode pads as shown in FIG. 1.

Accordingly, an image pickup device which can improve optical efficiency and packaging convenience, and a method of manufacturing the image pickup device is required.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides an image pickup device and package which can provide a high optical sensitivity and photoelectric efficiency irrespective of the structure of the wiring layers.

Another aspect of exemplary embodiments of the present invention provides an image pickup device and package which can achieve a wafer level package (WLP), simplify the manufacture process and remarkably reduce an installation space.

According to another aspect of exemplary embodiments of the present invention, there is provided an image pickup device. The image pickup device includes: a sensor substrate having a plurality of image sensors arranged in an image pickup region on the sensor substrate in the form of a matrix; an interlayer insulating film layer formed below a bottom surface of the sensor substrate, the interlayer insulating film layer including a plurality of insulating layers having wiring layers formed within the interlayer insulating film layer to construct an electric circuit; a support substrate attached on the bottom surface of the interlayer insulating film layer to be opposite to the sensor substrate, and having contact electrodes buried within the support substrate; and a lens layer formed over a top surface of the sensor substrate to be opposite to the interlayer insulating film layer, and having a plurality of microlenses formed within the lens layer.

A related art support substrate serves merely to support the silicon substrate whereas the inventive support substrate serves to support the sensor substrate and includes contact electrodes buried therein for electrically interconnecting the wiring layers and an external substrate. The contact electrodes are formed in via holes of the support substrate and functions to interconnect the top surface side and the bottom surface side of the support substrate. The use of the contact electrodes enables modularization of the image pickup device by means of a surface mount technology (SMT), reduction of the manufacturing cost of the module, and improvement of the module performance.

According to another aspect of exemplary embodiments of the present invention, there is provided a method of manufacturing an image pickup device including a sensor substrate having a plurality of image sensors arranged in an image pickup region of the sensor substrate in the form of a matrix, and an interlayer insulating film layer formed below a bottom surface of the sensor substrate, the interlayer insulating film layer having wiring layers formed within the interlayer insulating film layer to construct a driving circuit for driving the image sensors.

The image pickup device can be manufactured by attaching a support substrate having contact electrodes buried within the support substrate on a bottom surface of the interlayer insulating film layer to be opposite to the sensor substrate; and forming a lens layer having a plurality of microlenses formed within the lens layer over the top surface of the sensor substrate to be opposite to the interlayer insulating film layer. The support substrate includes contact electrodes buried in the support substrate for interconnecting the top surface side and the bottom surface side of the support substrate, and can interconnect the wiring layers and the contact electrodes simultaneously through a process of attaching the support substrate to the interlayer insulating film layer. Accordingly, related art wires are not necessary and the image pickup device can be simply and easily mounted on the semiconductor substrate.

Prior to formation of the lens layer, a color filter may be formed on the top surface of the sensor substrate. In addition, the top surface of the sensor substrate may be partially removed through a chemical mechanical planarization (CMP) method, a reactive ion etching (RIE) method, a back grind (BGR) method, or a combination thereof prior to formation of the lens layer.

According to another aspect of exemplary embodiments of the present invention, there is provided a light-transmitting member which may be formed over the lens layer after formation of the lens layer. The light-transmitting member includes a light-transmitting layer covered over the lens layer and spacers for allowing the light-transmitting layer to be mounted over the sensor substrate. Also, the light-transmitting member can protect the lens layer in a state where the lens layer is opened or closed. A glass material and the like may be used for the light-transmitting layer. When the spacers hermetically seal the lens layer against the outside, they can perform an anti-dust function, thereby improving the yield of the image pickup device.

BRIEF DESCRIPTION OF THE DRAWINGS

The above and/or other aspects of the present invention will become apparent and more readily appreciated from the following detailed description of exemplary embodiments, taken in conjunction with the accompanying drawings of which.

Throughout the drawings, like reference numerals will be understood to refer to like parts, components and structures.

DETAILED DESCRIPTION OF EXEMPLARY EMBODIMENTS OF THE INVENTION

Figure 1:
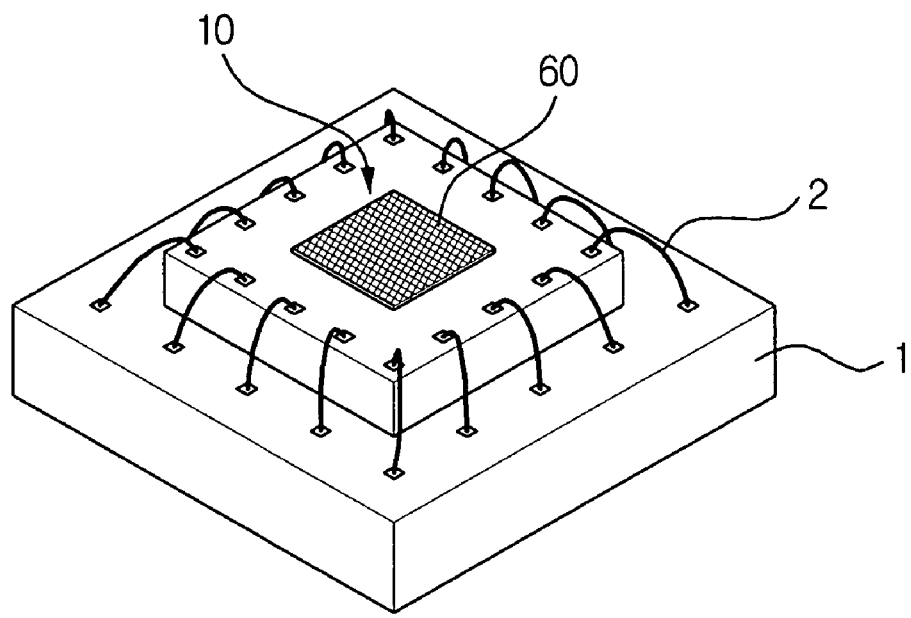
FIG. 1 is a perspective view illustrating the outer appearance of a related art image pickup device according to a related art.
Figure 2:
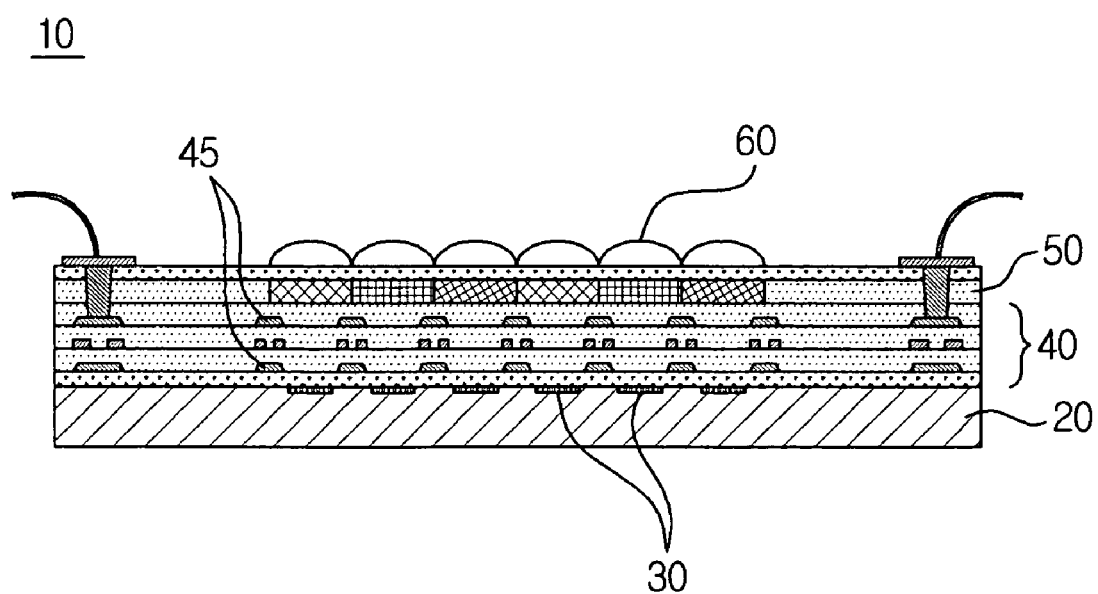
FIG. 2 is a cross-sectional view illustrating the image pickup device of FIG. 1.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
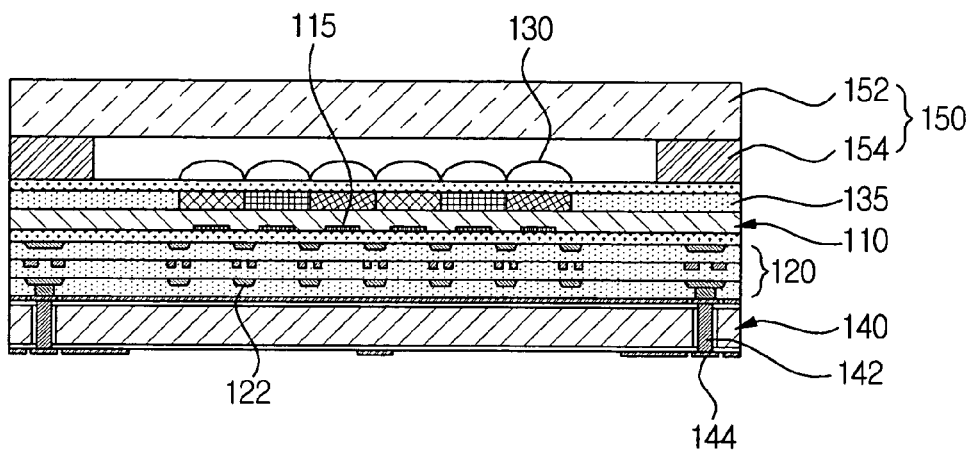
FIG. 3 is a cross-sectional view illustrating an image pickup device according to one exemplary embodiment of the present invention.

FIG. 3 is a cross-sectional view illustrating an image pickup device 100 according to an exemplary embodiment of the present invention.

Referring to FIG. 3, the image pickup device 100 includes a sensor substrate 110, an interlayer insulating film layer 120 having a plurality of insulating layers, a support substrate 140, a lens layer 130 having a plurality of microlenses formed therein, and a light-transmitting member 150.

The sensor substrate 110 has a plurality of image sensors 115 arranged in an image pickup region on the sensor substrate 110 in the form of a matrix for picking up images. Information acquired through the image sensors 115 can be transferred to the outside via the wiring layers 122 in the interlayer insulating film layer 120. Additionally, the support substrate 140 is formed with contact electrodes 142 buried within the support substrate 140 so that the image pickup device 100 can be functionally and physically connected with the outside simultaneously. Further, since the wiring layers 122 for the image sensors 115 are formed below the image sensors 115, they do not interrupt an optical path formed in an image pickup region and interference with the formation of complicated circuits and electrodes is reduced so as to more simply and freely form wirings and electrodes. After the light-transmitting member 150 has been attached onto the sensor substrate 110, the support substrate 140 may be made thin through a polishing or etching process.

More specifically, the sensor substrate 110 may be formed of a semiconductor or insulating material, preferably a monocrystalline silicon material. The image sensors 115, serving as photodiodes which can be formed through a CMOS process such as ion implantation and the like, may be formed in the bottom surface of the sensor substrate 110 and may be made of silicon.

The interlayer insulating film layer 120 may include multi-layered insulating layers and wiring layers 122 interposed therebetween. The multi-layered structure of the wiring layers 122 allows electrons generated from light-receiving sensors formed at respective unit pixels to be transmitted to an image signal processing section for conversion of an electric signal into a color signal. To this end, the interlayer insulating film layer 120, acting as a connection layer, may be formed as a silicon oxide film or a nitride film using a chemical vapor deposition (CVD) method. The wiring layers 122 may be formed of aluminum or copper.

The support substrate 140 includes contact electrodes 142 buried therein. The contact electrodes 142 function to interconnect the bottom surface side and the top surface side of the support substrate 140. In this exemplary embodiment, the bottom surface side of the support substrate 140 is directed toward the outside, and the top surface side of the support substrate 140 is in close contact with the bottom surface of the interlayer insulating film layer 120. The support substrate 140 is formed therein with via holes filled with the contact electrodes 142. Electroplating and grinding may be performed to form the contact electrodes 142. Prior to the formation of the contact electrodes 142, insulating films may be formed in the support substrate 140 by means of oxidation. Thereafter, the contact electrodes 142 can be formed in the support substrate 140 while maintaining an insulating state. The contact electrodes 142 of the support substrate 140 enable the electric connection between the wiring layers 122 and the external substrate. Since end portions of the contact electrodes 142 are exposed to the outside from the bottom surface of the support substrate 140, the electrode pads are not needed to be formed at the peripheral circuit region of the image pickup device 10 and the electrode pads 144 can be formed at the exposed end portions of the contact electrodes 142 on the bottom surface of the support substrate 140. Since the image pickup device can be mounted in a flip-chip connection scheme after formation of the electrode pad, it is possible to package the image pickup device in an actual chip size.

After the support substrate 140 has been attached on the bottom surface of the interlayer insulating film layer 120, the sensor substrate 110 can be made thin. The top surface of the sensor substrate 110 may be partially removed through a chemical mechanical planarization (CMP) method, a reactive ion etching (RIE) method, a back grind (BGR) method or the like. After the sensor substrate 110 has been made thin, the color filter 135, and the lens layer 130 may be formed on the top surface of the sensor substrate 110.

The light-transmitting member 150 is attached to the top surface of the sensor substrate 110. The light-transmitting member 150 includes a light-transmitting layer 152 and spacers 154 for allowing the light-transmitting layer 152 to be hermetically sealed to the sensor substrate 110. The spacers 154 may be provided at a peripheral region of an image pickup region where the lens layer 130 is formed, and is formed of epoxy resin, etc., so that the space defined between the light-transmitting layer 152 and the lens layer 130 can be isolated from the outside. Since the lens layer 130 is retained hermetically in the manufacturing process of the image pickup device, dust adhering to the surface of the lens layer may be prevented from occurring during a packaging process.

In addition, since the light-transmitting member 150 structurally supports the sensor substrate 110, a manufacturer can make the support substrate 140 thin. As mentioned above, the top surface of the sensor substrate 110 may be partially removed and the support substrate 140 may be made thin by grinding or etching.

Figure 4:
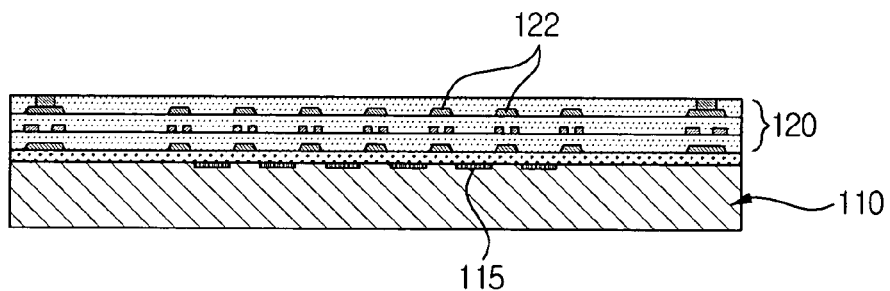
FIGS. 4 to 17 are cross-sectional views illustrating processes of manufacturing the image pickup device of FIG. 3.

FIGS. 4 to 17 are cross-sectional views illustrating processes of manufacturing the image pickup device of FIG. 3; and Referring to FIG. 4, a plurality of image sensors 115 are formed in the top surface of the sensor substrate 110 to be arranged in an image pickup region of the sensor substrate 110 in the form of a matrix, and the interlayer insulating film layer 120 including the wiring layers 122 of a multi-layered structure acting as an electric circuit is formed over the top surface of the sensor substrate 110. The wiring layers 122 are independently connected with the image sensors 115, and can transfer image signals sensed by the image sensors 115. The interlayer insulating film layer 120 including the wiring layers 122 is formed over the top surface of the sensor substrate 110.

Figure 5:
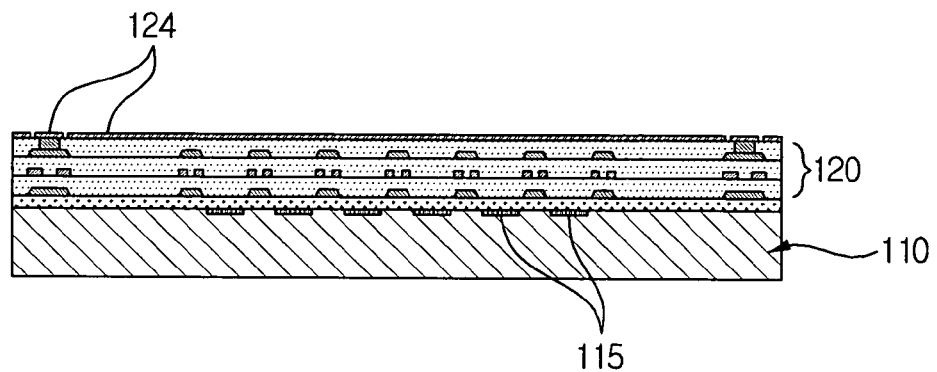

Referring to FIG. 5, a bumping metal pattern 124 is formed on the top surface of the interlayer insulating film layer 120. The bumping metal pattern 124 may be formed by means of a under-bumping metallization (UBM) process. The bumping metal pattern 124 generally may be formed using a gold-tin alloy, etc., and electrodes electrically connected with the wiring layers 122 are exposed to the outside from the top surface of the interlayer insulating film layer 120.

Figure 6:
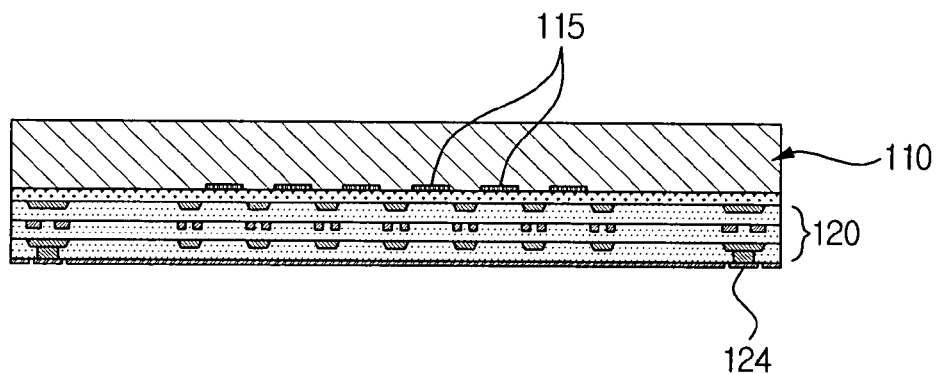

As shown in FIG. 6, after the bumping metal patterns 124 have been formed on the top surface of the interlayer insulating film layer 120 to form a resulting layered structure including the sensor substrate 110 and the interlayer insulating film layer 120, the layered structure is inverted. Then, the inverted layered structure can be attached on the support substrate 140.

Figure 7:
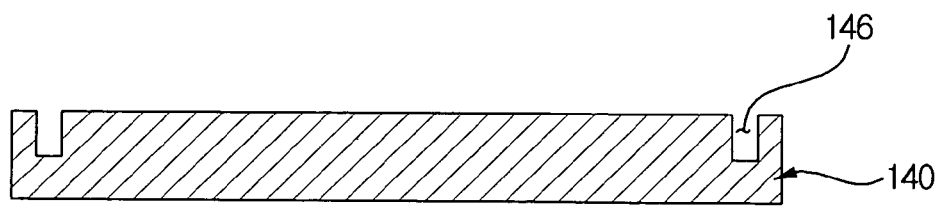

Referring to FIG. 7, the support substrate 140 may be provided independent from the sensor substrate 110 and the interlayer insulating film layer 120. The support substrate 140 includes contact holes 146 formed therein to correspond to the bumping metal pattern 124. The support substrate 140 may also be formed of a silicon material, and the contact holes 146 may be formed by anisotropic etching such as an RIE method. The contact holes 146 may be formed to have various shapes, amounts, and positions depending on the design requirements of the image pickup device 100.

Figure 8:
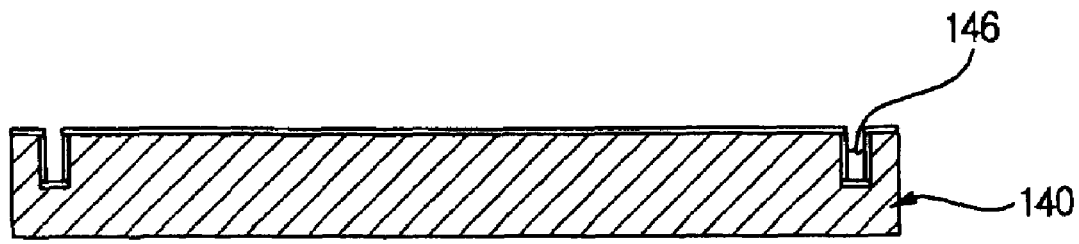

Referring to FIG. 8, after the contact holes 146 have been formed in the support substrate 140, the top surface of the support substrate 140 is subjected to oxidization. An insulating film 148 (shown in FIG. 9) made of silicon dioxide (SiO2) may be formed on the top surface of support substrate 140 by means of the oxidization of the silicon substrate. In this case, the insulating film 148 may be formed on the top surface or the bottom surface of the support substrate 140.

Figure 9:
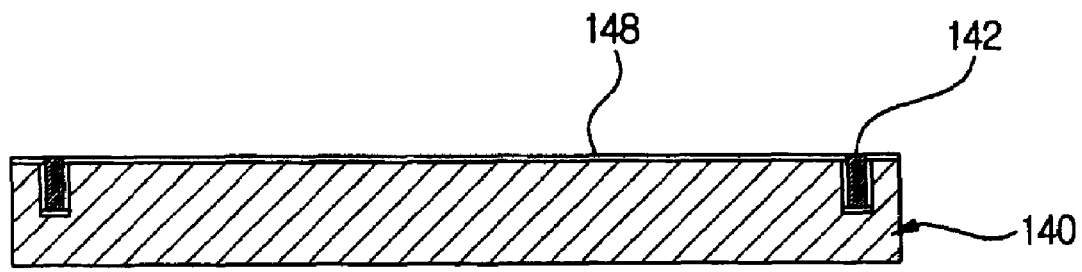

Referring to FIG. 9, contact electrodes 142 are filled in the contact holes 146 of the support substrate 140. The contact electrodes 142 may be formed of tungsten (W), aluminum (Al), copper (Cu), gold (Au), silver (Ag) and the like. For example, the contact electrodes 142 may be formed by an electroplating method. Before the electroplating method is performed in the contact holes 146, a seed metal film (not shown) may be formed in each of the contact holes 146.

Figure 10:
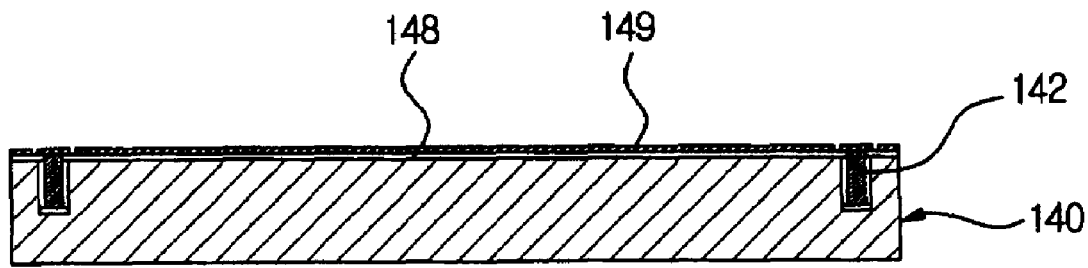

Referring to FIG. 10, the contact electrodes 142 are exposed to the outside from the top surface of the support substrate 140, and a solder bumping pattern 149 may be formed on the top surface of the support substrate 140 to correspond to the bumping metal pattern 124.

Figure 11:
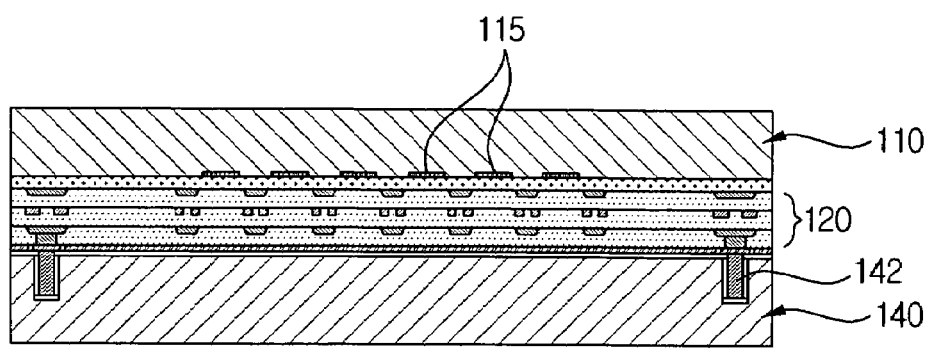

Referring to FIG. 11, the top surface of the solder bumping pattern of the support substrate 140 and the bottom surface of the bumping metal pattern 124 of the interlayer insulating film layer 120 abut against each other. The solder bumping pattern 149 and the bumping metal pattern 124 have pattern shapes corresponding to each other, and the wiring layer 122 and the contact electrodes 142 can be interconnected by both patterns.

Figure 12:
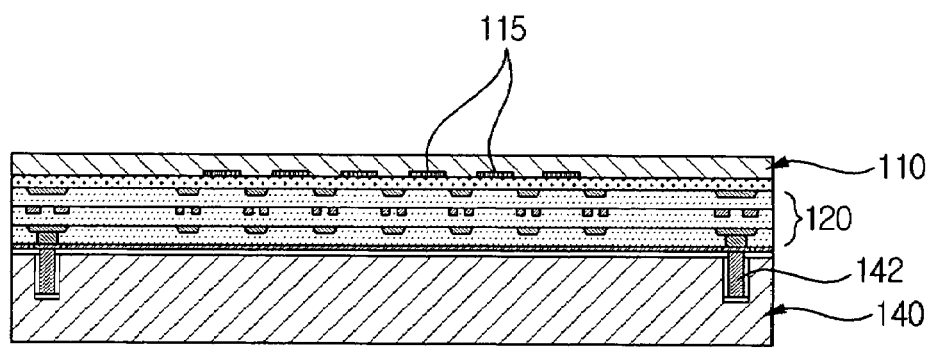

Referring to FIG. 12, the sensor substrate 110 is made thin. The top surface of the sensor substrate 110 may first be partially removed. In this case, a CMP method, an RIE method, a BGR method, or a combination thereof, may be used. Since the support substrate 140, formed on the bottom surface of the interlayer insulating film layer 120, supports the sensor substrate 110, it is possible to make the sensor substrate 110 thin.

Figure 13:
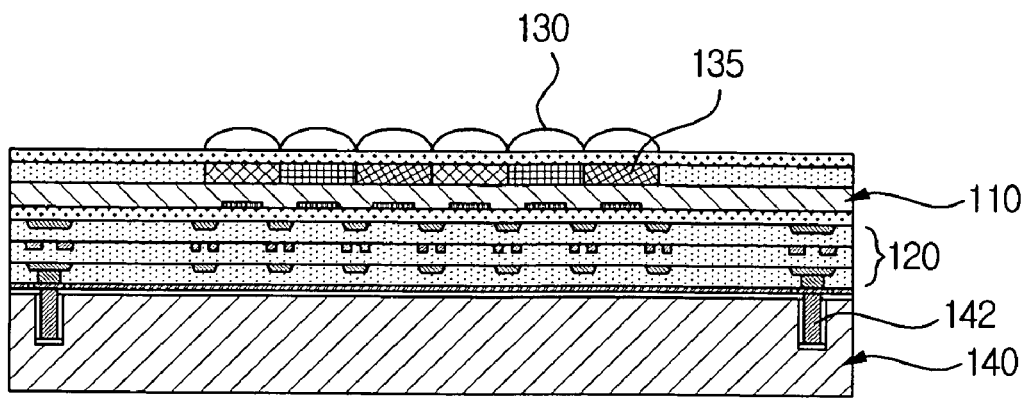

Referring to FIG. 13, a color filter 135 and a lens layer 130 are formed on the top surface of the sensor substrate 110. The color filter 135 and the lens layer 130 may be formed by a known method. For example, in order to form the lens layer 130 over the sensor substrate 110, a material for a formation of microlenses may be coated on the color filter 135, and the coated material is thermally treated to form the lens layer 130 having a curved surface.

Figure 14:
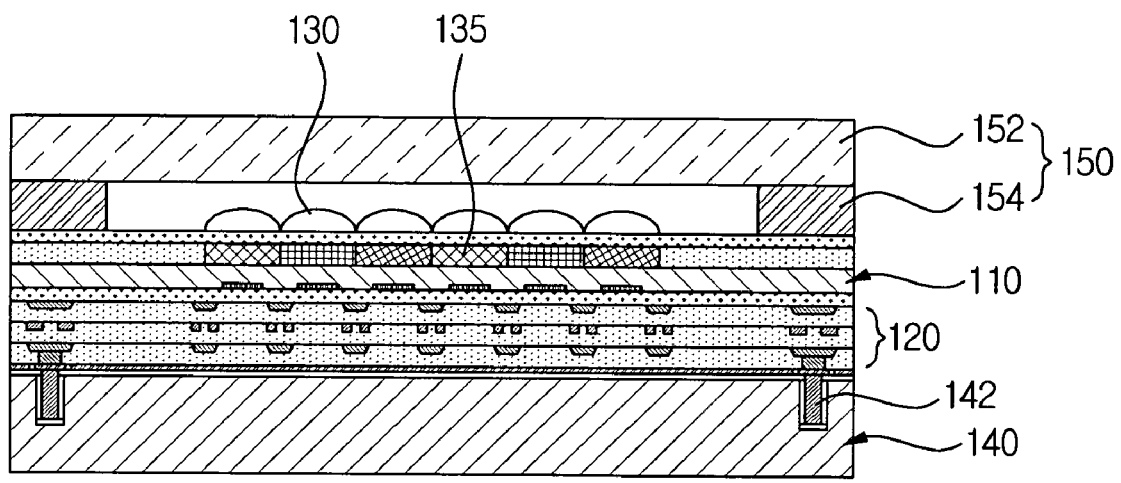

Referring to FIG. 14, the light-transmitting member 150 is attached over the top surface of the sensor substrate 110. The light-transmitting member 150 includes a light-transmitting layer 152 made of a glass material and spacers 154 for allowing the light-transmitting layer 152 to be positioned over the lens layer 130. The light-transmitting layer 152 is preferably disposed over the sensor substrate 110 to be spaced apart from the lens layer 130 by a given short interval. The space defined between the light-transmitting layer 152 and the lens layer 130 can be hermetically sealed against the outside. Since wavelengths in the infrared ray spectrum region induce distortion upon color reproduction, an infrared (IR) filter is required. In this case, IR coating may be performed for the top surface of the light-transmitting layer so as to reduce the cost and thickness of the image pickup device.

Figure 15:
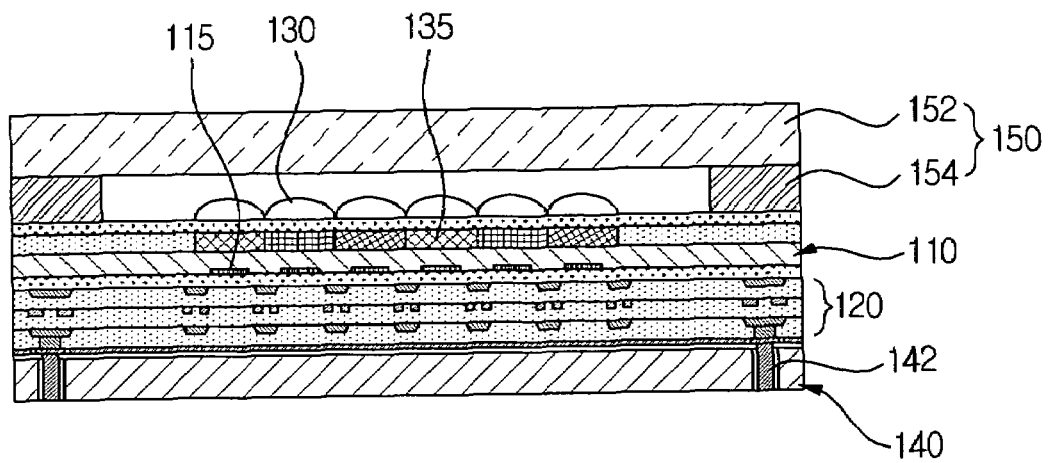

Referring to FIG. 15, the support substrate 140 is made thinner. The surface of the support substrate 140 may be partially removed by a CMP method, an RIE method, a BGR method, or a combination thereof. The partial removal of the surface of support substrate 140 may continue to be performed until the contact electrodes 142 are exposed to the outside. The contact electrodes 142 may be exposed by grinding or etching and the image sensors 115 and the external substrate are electrically interconnected via the exposed contact electrodes 142.

A plurality of contact electrodes 142 may be exposed to the outside from the surface of the support substrate 140 to correspond to the image sensors 115. The image pickup device can be mounted on the support substrate 140 through the electrodes formed on the bottom surface of the support substrate 140.

Figure 16:
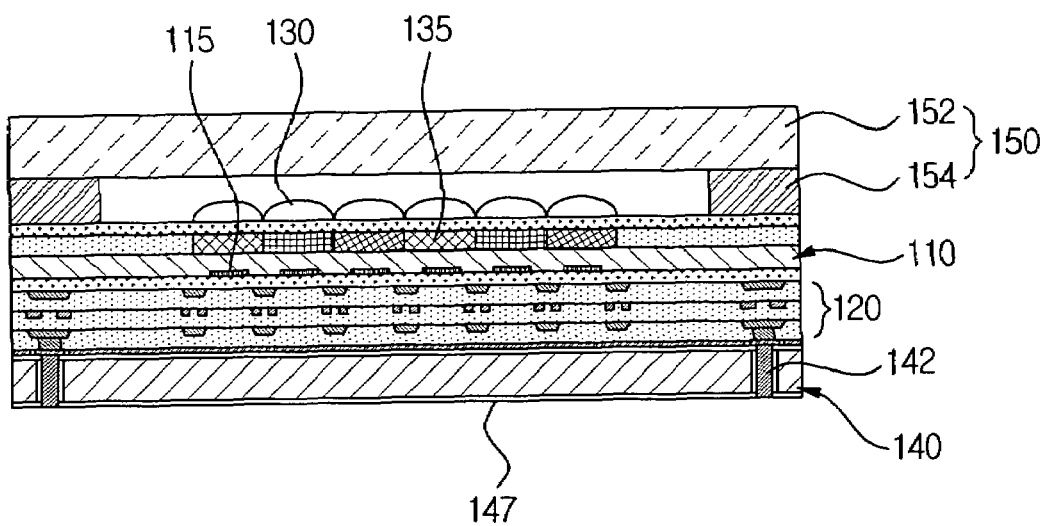

Referring to FIG. 16, another insulating film 147 may be formed on the bottom surface region of the support substrate excluding the exposed contact electrodes 142. The insulating film 147 may be formed by oxidizing and PR patterning the support substrate 140.

Figure 17:
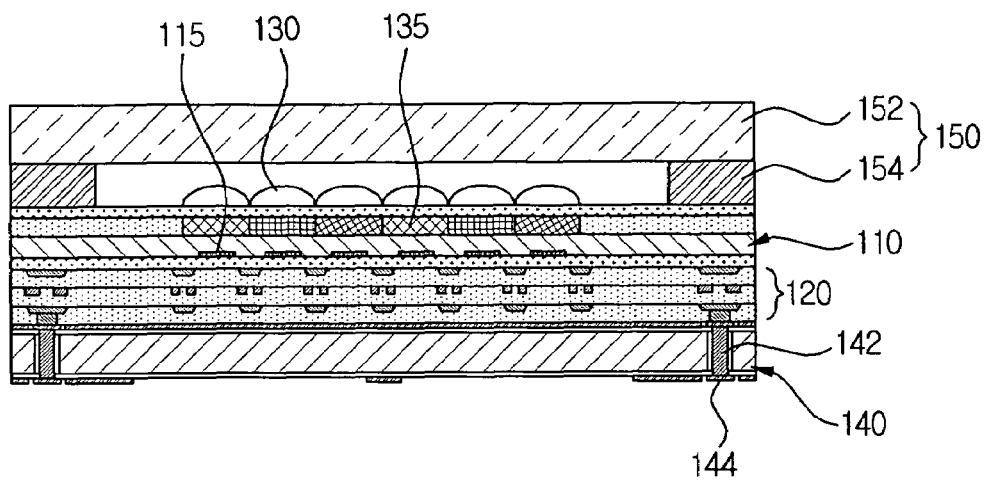

Referring to FIG. 17, the electrode pad 144 corresponding to the exposed contact electrodes 142 may be formed on the bottom surface of the support substrate 140. The electrode pad 144 may be formed of tungsten (W), copper (Cu), gold (Au), silver (Ag), or the like, for the purpose of installation of the external substrate.

The surface of the electrode pad 144 may be subjected to UBM processing for the purpose of soldering, and a soldering bump pad may be formed on the surface of the electrode pad 144.

Figure 18:
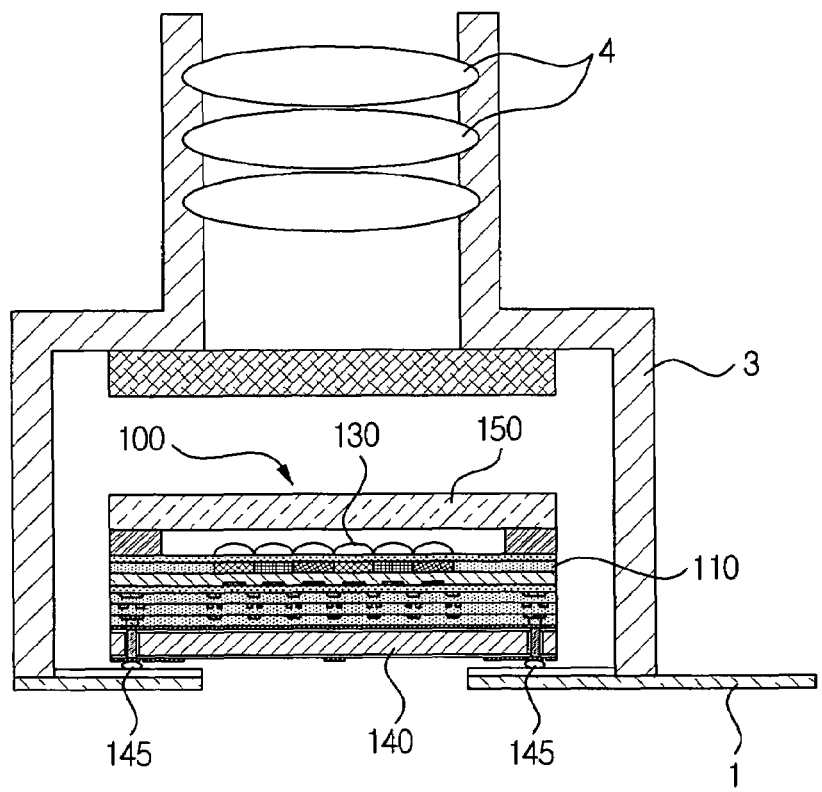
FIG. 18 is a cross-sectional view illustrating an image pickup package using the image pickup device shown in FIG. 17.

FIG. 18 is a cross-sectional view illustrating an image pickup package using the image pickup device shown in FIG. 17.

Referring to FIG. 18, the image pickup device 100 is mounted on an installation substrate 1. A housing 3 of the package is mounted on the installation substrate 1 or the image pickup device 100 and may be provided with lenses or filters 4 at the upper portion thereof.

In the related art image pickup device, the electrode pads are exposed to the outside from the peripheral region of the lens layer and are electrically connected with an external substrate via wires. On the other hand, the inventive image pickup device 100 can be mounted on the installation substrate 1 by means of soldering bumps 145 that allows the image sensors 115 to be electrically connected with the installation substrate 1 via the contact electrodes 142.

Since the image pickup device 100 does not allow the electrode pads to be formed at the peripheral region of the lens layer 130, the device 100 occupies only a small installation area. In addition, the sensor substrate 110 can be made thin by using the support substrate 140, and the support substrate 140 can be made thin by using the light-transmitting member 150. Thus, it is possible to fabricate a thinner image pickup device 100.

The image pickup device according to the exemplary embodiments of the present invention can provide a high optical sensitivity and photoelectric efficiency irrespective of the structure of the wiring layers.

The inventive image pickup device can be mounted on an installation substrate and can electrically and functionally interconnect the terminals of the installation substrate and the image sensors. The support substrate serves to both support the substrate in the process of making a thin silicon substrate or sensor substrate, and to functionally interconnect the substrate and the inner image sensors by having the contact electrodes formed therein.

Furthermore, the inventive image pickup device can achieve a wafer level package (WLP), simplify the manufacture process and remarkably reduce an installation space.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An image pickup device comprising:
    a sensor substrate which has a plurality of image sensors arranged in an image pickup region on the sensor substrate, in the form of a matrix;
    an interlayer insulating film layer formed below a bottom surface of the sensor substrate, the interlayer insulating film layer including a plurality of insulating layers which have wiring layers formed within the interlayer insulating film layer to construct an electric circuit with the image sensors;
    a support substrate attached on a bottom surface of the interlayer insulating film layer to be opposite to the sensor substrate, which support substrate include;
        a top surface proximate the interlayer insulating film layer,
        a bottom surface opposing the top surface and distal the sensor substrate, and
        contact electrodes buried within the support substrate, extending between the top surface and the bottom surface and being electrically coupled to the wiring layers of the interlayer insulating film layer at the top surface to electrically connect the top surface to the image sensors through the wiring layers; and
    a lens layer formed over a top surface of the sensor substrate to be opposite to the interlayer insulating film layer, which lens layer has a plurality of microlenses formed within the lens layer.

2. The image pickup device of claim 1 further comprising a color filter interposed between the lens layer and the sensor substrate.

3. The image pickup device of claim 1, wherein the interlayer insulating film layer includes a bumping metal pad formed on the bottom surface of the interlayer insulating film layer, a solder bumping pad is formed at an end portion of each of the contact electrodes which correspond to the bumping metal pad, and the wiring layers and the contact electrodes are electrically interconnected by a bonding between the bumping metal pad and the solder bumping pad.

4. The image pickup device of claim 1, wherein an electrode pad is formed at an end portion of each contact electrode which is exposed to the outside from the bottom surface of the support substrate.

5. The image pickup device of claim 1, wherein the contact electrodes buried in the support substrate are exposed to the outside by removing the top surface of the support substrate.

6. A method of manufacturing an image pickup device including:
   a sensor substrate having a plurality of image sensors arranged in an image pickup region of the sensor substrate in a form of a matrix;
   an interlayer insulating film layer formed below a bottom surface of the sensor substrate, the interlayer insulating film layer including a plurality of insulating layers and having wiring layers formed within the interlayer insulating film layer to construct an electric circuit with the image sensors;
   a support substrate attached on a bottom surface of the interlayer insulating film layer to be opposite to the sensor substrate, which support substrate includes:
      a top surface proximate the interlayer insulating film layer,
      a bottom surface opposing the top surface and distal the sensor substrate, and
      contact electrodes buried within the support substrate, extending between the top surface and the bottom surface and being electrically coupled to the wiring layers of the interlayer insulating film layer at the top surface to electrically connect the top surface to the image sensors through the wiring layers; and
   a lens layer formed over a top surface of the sensor substrate to be opposite to the interlayer insulating film layer, which lens layer has a plurality of microlenses formed within the lens layer, the method comprising:
   attaching the support substrate having contact electrodes buried within the support substrate on the bottom surface of the interlayer insulating film layer to be opposite to the sensor substrate; and
   forming the lens layer having the plurality of microlenses formed within the lens layer over the top surface of the sensor substrate to be opposite to the interlayer insulating film layer.

7. The method of claim 6, wherein a color filter is formed on the top surface of the sensor substrate prior to the forming of the lens layer.

8. The method of claim 6, wherein the top surface of the sensor substrate is partially removed prior to the forming of the lens layer.

9. The method of claim 6, wherein the contact electrodes buried in the support substrate are exposed to the outside by partially removing the top surface of the support substrate.

10. An image pickup device comprising:
   a sensor substrate which has a plurality of image sensors arranged in an image pickup region on the sensor substrate, in a form of a matrix;
   an interlayer insulating film layer formed below a bottom surface of the sensor substrate, the interlayer insulating film layer including a plurality of insulating layers having wiring layers formed within the interlayer insulating film layer to construct an electric circuit, the wiring layer being electrically connected with the image sensors;
   a support substrate attached on a bottom surface of the interlayer insulating film layer, the support substrate having contact electrodes buried within the support substrate which electrodes extend between a bottom surface side and a top surface side of the support substrate and are electrically coupled to the wiring layers of the interlayer insulating film layer at the top surface side to electrically connect the top surface side to the image sensors through the wiring layers;
   a lens layer formed over a top surface of the sensor substrate to be opposite to the interlayer insulating film layer, the lens layer having a plurality of microlenses formed within the lens layer; and
   a light-transmitting member which includes a light-transmitting layer which covers the lens layer, and spacers which allows the light-transmitting layer to be mounted over the sensor substrate.

11. The image pickup device of claim 10, further comprising a color filter interposed between the lens layer and the sensor substrate.

12. The image pickup device of claim 10, wherein the wiring layers are formed in a multi-layered structure.

13. The image pickup device of claim 10, wherein the interlayer insulating film layer includes a bumping metal pad formed on a bottom surface of the interlayer insulating film layer, a solder bumping pad is formed at an end portion of each of the contact electrodes which correspond to the bumping metal pad, and the wiring layers and the contact electrodes are electrically interconnected by the bonding between the bumping metal pad and the solder bumping pad.

14. The image pickup device of claim 10, wherein an electrode pad is formed at an end portion of each contact electrode exposed to the outside from a bottom surface of the support substrate.

15. The image pickup device of claim 14, wherein the electrode pad is formed with a soldering bump for interconnection with the support substrate.

16. The image pickup device of claim 10, wherein the contact electrodes buried in the support substrate are exposed to the outside by removing the top surface of the support substrate.

17. The image pickup device of claim 10, wherein the spacers hermetically seal a space defined between the light-transmitting layer and the lens layer, from the outside.

18. A method of manufacturing an image pickup device including:
   a sensor substrate having a plurality of image sensors arranged in an image pickup region of the sensor substrate in a form of a matrix;
   an interlayer insulating film layer formed below a bottom surface of the sensor substrate, the interlayer insulating film layer including a plurality of insulating layers and having wiring layers formed within the interlayer insulating film layer to construct an electric circuit for driving the image sensors, the wiring layer being electrically connected with the image sensors;

a support substrate attached on a bottom surface of the interlayer insulating film layer, the support substrate having contact electrodes buried within the support substrate which electrodes extend between a bottom surface side and a top surface side of the support substrate and are electrically coupled to the wiring layers of the interlayer insulating film layer at the top surface side to electrically connect the top surface side to the image sensors through the wiring layers;

a lens layer formed over a top surface of the sensor substrate to be opposite to the interlayer insulating film layer, the lens layer having a plurality of microlenses formed within the lens layer; and a light-transmitting member which includes a light-transmitting layer which covers the lens layer, and spacers which allows the light-transmitting layer to be mounted over the sensor substrate, the method comprising:

attaching the support substrate having contact electrodes buried within the interlayer insulating film layer on the bottom surface of the interlayer insulating film layer;

forming the lens layer having the plurality of microlenses formed within the lens layer over the top surface of the sensor substrate to be opposite to the interlayer insulating film layer; and forming the light-transmitting layer over the lens layer by using spacers such that the light-transmitting layer and the spacers are integrally formed with each other.

19. The method of claim 18, wherein a color filter is formed on the top surface of the sensor substrate prior to the forming of the lens layer.

20. The method of claim 18, wherein the top surface of the sensor substrate is partially removed prior to the forming of the lens layer.

21. The method of claim 18, wherein the contact electrodes buried in the support substrate are exposed to the outside by partially removing the top surface of the support substrate.

* * * * *